(12) United States Patent
Zebhauser et al.

(10) Patent No.: US 11,937,386 B2
(45) Date of Patent: Mar. 19, 2024

(54) FRONT PLATE FOR A HOUSING OF A CONTROL INSTALLATION, HOUSING MODULE, CONNECTION ASSEMBLY, AND VEHICLE

(71) Applicant: Rosenberger Hochfrequenztechnik GmbH & Co. KG, Fridolfing (DE)

(72) Inventors: Martin Zebhauser, Laufen (DE); Christian Zwinger, Traunstein (DE); Christian Anfang, Bergen (DE)

(73) Assignee: Rosenberger Hochfrequenztechnik GmbH & Co. KG, Fridolfing (DE)

( * ) Notice: Subject to any disclaimer, the term of this patent is extended or adjusted under 35 U.S.C. 154(b) by 172 days.

(21) Appl. No.: 17/386,845

(22) Filed: Jul. 28, 2021

(65) Prior Publication Data
US 2022/0039269 A1 Feb. 3, 2022

(30) Foreign Application Priority Data

Jul. 30, 2020 (DE) .................... 10 2020 120 184.2
Sep. 8, 2020 (EP) ..................................... 20195108

(51) Int. Cl.
| | |
|---|---|
| H01R 12/00 | (2006.01) |
| B60R 16/023 | (2006.01) |
| H01R 13/518 | (2006.01) |
| H01R 13/52 | (2006.01) |
| H05K 5/00 | (2006.01) |
| H05K 5/06 | (2006.01) |
| H05K 9/00 | (2006.01) |

(52) U.S. Cl.
CPC ......... *H05K 5/0069* (2013.01); *B60R 16/023* (2013.01); *H01R 13/518* (2013.01); *H01R 13/5202* (2013.01); *H05K 5/069* (2013.01); *H05K 9/0015* (2013.01); *H05K 9/0018* (2013.01); *H01R 2201/26* (2013.01); *H05K 5/0047* (2013.01)

(58) Field of Classification Search
CPC .............. H01R 13/518; H01R 13/5202; H01R 2201/26; H05K 5/0069; H05K 5/069; H05K 9/0015; H05K 9/0018; H05K 5/0047; B60R 16/023
USPC ....................................................... 439/76.2
See application file for complete search history.

(56) References Cited

U.S. PATENT DOCUMENTS

| | | | | |
|---|---|---|---|---|
| 3,270,267 | A | * 8/1966 | Nolte, Jr. .................. | B60L 1/04 200/51.09 |
| 3,614,537 | A | * 10/1971 | Introvigne ........... | H01R 13/713 361/601 |
| 4,775,327 | A | * 10/1988 | Normann ............. | G02B 6/3807 439/140 |
| 5,641,294 | A | 6/1997 | Beard | |

(Continued)

OTHER PUBLICATIONS

European Search Report dated Nov. 6, 2020.

*Primary Examiner* — Abdullah A Riyami
*Assistant Examiner* — Vladimir Imas
(74) *Attorney, Agent, or Firm* — Randall Danskin P.S.

(57) ABSTRACT

The invention relates to a front plate for a housing of a control installation, having a feedthrough for a plug connector. The front plate has at least one compensation element for compensating a tolerance-related offset ($V_A$, $V_R$) between the plug connector and the feedthrough (10) is disposed in the feedthrough and/or adjacent to the feedthrough.

17 Claims, 6 Drawing Sheets

(56) References Cited

U.S. PATENT DOCUMENTS

| | | | | |
|---|---|---|---|---|
| 6,454,368 B1* | 9/2002 | Bedau | H01R 13/518 | 312/223.1 |
| 6,848,925 B2* | 2/2005 | Nishide | H01R 13/73 | 439/157 |
| 7,140,923 B2* | 11/2006 | Karir | H05K 9/0018 | 439/676 |
| 7,525,818 B1* | 4/2009 | McAlonis | H05K 9/0018 | 361/728 |
| 7,789,690 B1* | 9/2010 | Rhein | H01R 13/707 | 439/352 |
| 7,850,485 B2* | 12/2010 | Bartholoma | H01R 13/748 | 439/550 |
| 8,192,212 B2* | 6/2012 | Casses | H01R 13/6272 | 439/181 |
| 8,373,390 B2* | 2/2013 | Oh | B60L 3/0069 | 320/109 |
| 8,575,480 B2* | 11/2013 | Young | H05K 5/0069 | 248/463 |
| 9,071,023 B2* | 6/2015 | Kondo | H01R 13/6581 | |
| 9,397,459 B2* | 7/2016 | Butcher | H01R 33/95 | |
| 9,413,095 B2* | 8/2016 | Miyazaki | H01R 13/514 | |
| 9,531,126 B2* | 12/2016 | Krietzman | H01R 13/639 | |
| 9,543,698 B2* | 1/2017 | Tanigawa | H01R 13/6271 | |
| 10,038,270 B2* | 7/2018 | Fabre | H01R 13/645 | |
| 10,340,626 B2* | 7/2019 | Kondo | H01R 13/5202 | |
| 10,811,810 B2* | 10/2020 | Nishijima | H01R 13/5219 | |
| 10,820,439 B2* | 10/2020 | Pham | H01R 13/5202 | |
| 10,985,506 B2* | 4/2021 | Felde | H01R 13/6581 | |
| 11,081,817 B2* | 8/2021 | Fujisaki | H01R 33/06 | |
| 11,128,076 B2* | 9/2021 | Villarreal | H01R 13/111 | |
| 11,489,286 B2* | 11/2022 | Menez | H01R 13/62922 | |
| 2008/0102668 A1* | 5/2008 | Ikeya | H01R 43/26 | 439/157 |
| 2013/0277191 A1* | 10/2013 | Trolese | H02H 3/162 | 200/501 |
| 2020/0094968 A1* | 3/2020 | Sloboda | H01R 13/518 | |

\* cited by examiner

FRONT PLATE FOR A HOUSING OF A CONTROL INSTALLATION, HOUSING MODULE, CONNECTION ASSEMBLY, AND VEHICLE

CROSS REFERENCE TO RELATED APPLICATIONS

This Non-Provisional Patent Application is a United States National Stage Patent Application which claims the benefit of priority to earlier filed German Patent Application No. 10 2020 120 184.2, which was filed on 30 Jul. 2020, and further claims the benefit of priority to earlier filed European Patent Application No. 20 195 108.4, which was filed on 8 Sep. 2020. The entire contents of the aforementioned earlier filed German Patent Application and earlier filed European Patent Application are both expressly incorporated herein by this reference.

Pursuant to USPTO rules, this foreign priority claim to earlier filed German Patent Application No. 10 2020 120 184.2 and to earlier filed European Patent Application No. 20 195 108.4 is also included in the Application Data Sheet (ADS) filed herewith.

TECHNICAL FIELD

The invention relates to a front plate for a housing of a control installation.

The invention moreover relates to a housing module, having a front plate and a housing.

The invention furthermore relates to a connection assembly for a vehicle, in particular for a motor vehicle, having a housing module, a control installation and a plug connector.

The invention moreover relates to a vehicle, in particular a motor vehicle, having a connection assembly.

BACKGROUND

Control installations, also referred to as "control apparatuses" in the context of the use of said control installations in vehicles, handle various tasks of open-loop and/or closed-loop control within electronic systems. To this end, sensors can be evaluated by the control installation, and actuators or display apparatuses such as displays or visual signal emitters actuated by the control installation, for example. A control apparatus is furthermore typically provided with program and/or data memories and data connections (for example data bus systems) for communicating with further electronic installations.

A control installation is typically constructed partially or completely on an electric circuit board by interconnecting various electric components and/or integrated circuits. The control installation, in particular the circuit board of the latter, is often received in a housing module. Circuit board plug connectors for connecting to external electrical systems such as, for example, sensors, actuators, further control installations or power sources, are typically provided on the circuit board. A releasable connection to the external electrical systems, even across comparatively large distances, for example between an interior and the engine bay of a vehicle, can then be established by way of a corresponding mating plug connector and a cable. To this end, the individual plug connectors are typically routed to the outside by way of respective cutouts in a front plate of the housing module.

The production and assembly of a system of this type is comparatively complex. The individual plug connectors, or circuit board plug connectors, respectively, by virtue of assembly-related tolerances (for example by virtue of a soldering process) and by virtue of production tolerances, cannot always be positioned so as to be aligned exactly with the corresponding feedthrough of the front plate. In order to nevertheless enable in each case final assembling, either a very exact and thus also cost-intensive production and assembly of the individual components is required, or compromises have to be made in terms of the tightness between the feedthrough and the respective plug connector.

High requirements are set in particular in terms of the ruggedness and reliability of connection assemblies for the automotive industry, and for vehicles, respectively. A corresponding connection assembly thus has to withstand high loads, for example mechanical loads, and remain functionally ready even under inclement environmental conditions. It is a priority that safety is guaranteed in particular in the autonomous operation of vehicles and driver assistance systems.

In view of the known prior art, an object of the present invention thus lies in providing a front plate for a housing of a control installation, said front plate being easy to assemble in the context of final assembling, and having a high degree of tightness in relation to moisture and dirt, and a long service life.

It is also an object of the invention to provide a housing module and a connection assembly which are easy to assemble in the context of final assembling and have a high degree of tightness in relation to moisture and dirt, and a long service life.

The claims and the features described and disclosed herein relate to advantageous embodiments and variants of the invention.

Provided is a front plate for a housing of a control installation. The front plate has a feedthrough for a plug connector.

The feedthrough is preferably configured to be rectangular, for example only, and without limitation, a square. In principle however, the feedthrough can have any arbitrary shape and also be configured to be round or elliptic, for example. The feedthrough can preferably be adapted to the external shape of the plug connector to be routed through the feedthrough. Insofar as a plurality of feedthroughs are provided within the front plate, the feedthroughs may also have different shapes and sizes.

The front plate has at least one compensation element for compensating a tolerance-related offset between the plug connector and the feedthrough and the compensation element is disposed in the feedthrough and/or adjacent to the feedthrough.

The front plate can preferably be configured for assembling on the housing in such a manner that one plug connector, or a plurality of plug connectors, protruding from the housing in the direction of the front plate, during assembling are routed through respective corresponding feedthroughs of the front plate. The front plate can thus advantageously be able to be placed onto an existing connection installation, and in the case of servicing, optionally be removable from the housing again.

By using the compensation element, it is possible for the feedthrough to be configured to be sufficiently larger than the plug connector such that the front plate is still able to be assembled on the housing in a manner which is simple and provides a reliable process even in the case of large tolerances, and thus in particular in the case of the largest offset to be expected.

The compensation element can be configured for compensating a parallel offset of a longitudinal axis of the plug connector and of a central axis of the cutout, and/or a tilting angle between the longitudinal axis of the plug connector and of the central axis of the cutout. An offset in the axial direction between the plug connector and the cutout can optionally also be compensated for, or at least taken into account, by the compensation element.

The compensation element can in principle provide various functionalities, for example only, and not limited to, be a seal, a shielded transmission and/or a fastening. The individual functions of the compensation element that can optionally be implemented will be discussed in more detail herein.

In one advantageous refinement of the invention, it can be provided that the feedthrough has a groove for receiving the compensation element, and/or a step for bearing the compensation element.

A plurality of grooves and/or steps within the feedthrough can also be provided, in particular one respective groove or step, respectively, per compensation element.

The grooves can be configured in the shape of subrings, or preferably complete rings, so as to be encircling within internal walls of the feedthrough. The steps can also be configured in the shape of subrings, or preferably complete rings, within the feedthrough. However, individual bearing faces within the feedthrough, or individual recesses within the lateral walls of the feedthrough, can also be provided.

According to a refinement of the invention, it can be provided that the compensation element is configured in the shape of a subring, or a ring.

The compensation element is preferably configured in the shape of a ring, or subring to be completely closed along a circumference of said compensation element, respectively.

The compensation element can be configured to be integral or in multiple parts.

The compensation element can also be configured from a plurality of individual components which are disposed to be distributed along the circumference of the feedthrough. The individual components can preferably be spring elements, for example coil springs, leaf springs and/or compression springs. The individual components, in particular the spring elements, can be disposed between the feedthrough and the plug connector.

According to a refinement of the invention, it can be provided that at least one of the compensation elements is configured as a sealing element. The sealing element compensation element can consequently have a sealing function.

The sealing element can seal the interior of the housing in relation to the ingress of moisture, dust, dirt, etc. At the same time, the offset between the plug connector and the feedthrough can be compensated.

A plurality of sealing elements per feedthrough may also be provided (so as to be offset axially and/or along the circumference of the feedthrough), but exactly one sealing element is preferably provided per feedthrough.

The sealing element is preferably positioned on an internal wall of the feedthrough and optionally fastened or held/secured in the feedthrough.

In principle however, the sealing element can also be disposed to be merely adjacent to the feedthrough, and in this instance preferably protrude radially into the feedthrough, in the direction toward the central axis of the feedthrough. The sealing element can optionally be fastened to an end side of the front plate.

The sealing element, in the assembled state thereof, preferably bears on a step within the feedthrough. In the assembled state of the plug connector, the sealing element can in this instance optionally be disposed between the step of the feedthrough and a protrusion of the plug connector. The sealing element can however also be disposed within a groove of the feedthrough.

In a refinement of the invention it can be provided that the sealing element has a plurality of sealing lips which, in the axial direction, are mutually offset along a central axis of the sealing element.

The sealing lips are preferably offset so as to be mutually equidistant.

The sealing element is preferably configured as an annular seal.

The sealing element is preferably configured from silicone, natural rubber, synthetic rubber or any other elastomer.

In a refinement of the invention it can be provided that at least one of the compensation elements is configured as a shielding element to establish an electrical connection between an external conductor of the plug connector and the front plate.

Additionally, or alternatively, the compensation element can also have a shielding function. Electrical shielding of the front plate, or of the housing, respectively, in principle is however only optional, which is why a shielding element, or a shielding function of the compensation element, respectively, does not have to be mandatorily provided.

The front plate, and optionally the housing which is connected to the front plate in the assembled state, can be connected to a common reference potential, for example a ground, of the plug connector and/or of the control installation by way of the shielding element. The electromagnetic compatibility of the entire connection assembly can be improved in this way.

When a shielding element is used, the front plate is preferably configured from a metal, or comprises at least one metal or any other conductive component. In principle however, the front plate and/or the housing may also be configured from a plastic material, or comprise at least one plastic material.

The shielding element can preferably be configured from a metal or any other conductive material.

Each feedthrough preferably has exactly one shielding element. However, a plurality of shielding elements can also be provided per feedthrough (offset axially and/or along the circumference of the feedthrough).

Each feedthrough preferably has exactly one sealing element and exactly one shielding element. A combined sealing element and shielding element can optionally also be provided. To this end, the sealing element described herein can be produced from an elastomer having integrated metal particles or metal fibers, for example.

In one advantageous refinement of the invention it can be provided that the shielding element has a plurality of contact elements which are mutually offset along a circumference of the shielding element.

The contact elements are preferably offset from one another so as to be mutually equidistant.

Electrical contacting which is ideally fully circumferential between the front plate and the plug connector can contribute toward providing a particularly high degree of electromagnetic compatibility and the suitability of the connection assembly for the high-frequency engineering sector.

In principle, arbitrary types of contact elements, for example sprung or unsprung contact pins, sliding contacts, contact points, contact faces, etc., can be provided.

In one refinement of the invention it can, in particular, be provided that the contact elements are configured as spring lugs.

For example, the shielding element can be configured in the manner of a spring bush. An offset between the feedthrough and the plug connector can be particularly advantageously compensated by sprung spring lugs.

In a refinement of the invention, two groups of spring lugs can be provided, A first group of inner spring lugs can be configured for contacting the external conductor of the plug connector. A second group of outer spring lugs can be configured for contacting the front plate.

Optionally, however, only a single group of spring lugs can also be provided, the spring lugs thereof being configured for contacting the external conductor of the plug connector, and the front plate. To this end, the spring lugs can have a plurality of kinks or bends, respectively, and/or configure a curved profile.

In one advantageous refinement of the invention, it can be provided that the spring lugs, by way of a respective first end portion, are attached to the shielding element, and have a respective free second end portion so as to contact the external conductor of the plug connector, or the front plate, respectively. Unilaterally attached spring lugs are thus preferably provided.

In principle however, spring lugs which at both ends, or by way of both end portions, respectively, are attached to the shielding element, and contact the external conductor of the plug connector and/or the front plate by way of a central portion which runs between the respective end portions can also be provided. The use of unilaterally attached spring lugs is however preferable for reasons of simpler producibility of the shielding element.

In one advantageous refinement of the invention it can be provided that the spring lugs are aligned in such a manner that the free second end portion of said spring lugs extends away from the front plate.

In this variant, the shielding element, for example by way of a base that connects the two groups of spring lugs, can bear in a planar manner on a step within the feedthrough or adjacent to the feedthrough. As a result, thereof, the shielding element can be positioned particularly close to the front plate. The assembling and fastening of a shielding element configured in such a manner can be particularly simple.

In a refinement of the invention, it can alternatively be provided that the spring lugs are aligned in such a manner that the free second end portion of said spring lugs extends in the direction of the front plate.

In this variant, introducing the plug connector into the feedthrough can be simplified by virtue of the inner spring lugs that point in the direction of assembling. Damage to the spring lugs in the case of an excessive offset between the plug connector and the feedthrough can in particular also be almost entirely precluded.

According to a refinement of the invention, it can alternatively also be provided that the inner spring lugs are aligned in such a manner that the free second end portion of said inner spring lugs extends in the direction of the front plate, wherein the outer spring lugs are aligned in such a manner that the free second end portion of said outer spring lugs extends away from the front plate.

In this variant, the assembling of the shielding element, on the one hand, and simultaneously also the assembling of the plug connector within the feedthrough, or within the shielding element, respectively, can be particularly simple.

In an advantageous refinement of the invention it can be provided that the inner spring lugs in the region of the free second end portion of said inner spring lugs have at least one bend, so as to configure a capture region for the plug connector for assembling of the plug connector.

As a result, thereof, the placing of the front plate on the housing, or the introducing of the plug connector into the individual feedthroughs, respectively, can still be comfortable even at large tolerances, or at a large offset between the plug connectors and the feedthroughs, respectively.

The shielding element can preferably be produced from a sheet-metal part, in particular in the context of a stamping/bending process.

In a refinement it can be provided that the front plate has at least one mounting structure which can be used for fastening the plug connector and/or the compensation element to the front plate.

The mounting structure can be configured to be integral to the front plate or to be in multiple parts with the front plate. The mounting structure is preferably configured to be integral to the front plate.

In an advantageous refinement of the invention it can be provided that the mounting structure, proceeding from the front plate, extends into an internal side of the housing.

The feedthrough preferably runs through the front plate and through the mounting structure.

The mounting structure is preferably configured in the shape of a sleeve, or closed along a circumference of said mounting structure, respectively. This is however not absolutely necessary.

According to a refinement of the invention, it can be provided that the compensation element, proceeding from the internal side of the housing, is able to be placed onto the mounting structure or introduced into the mounting structure.

In principle, any arbitrary fastening technique (a form-fitting, force-fitting and/or materially integral fastening technique) can be provided for fastening the compensation element in the feedthrough or adjacent to the feedthrough. For example only, and without limitation, the compensation element in the feedthrough, or adjacent to the feedthrough, or at any arbitrary location on the front plate, can be screwed, riveted, soldered/brazed, welded or latched. Adhesive bonding, or even an integral design embodiment of the compensation element and the front plate, can also be provided.

In an advantageous refinement of the invention it can in particular be provided that the mounting structure has a first latching element, and the compensation element has a corresponding second latching element, said latching elements conjointly configuring a latching element pair for latching the compensation element to the mounting structure.

A plurality of latching element pairs is preferably provided, for example in each case one latching element pair at each corner of the feedthrough.

For example, exactly one latching element pair, two latching element pairs or more latching element pairs, three latching element pairs or more latching element pairs, four latching element pairs or more latching element pairs, five latching element pairs or more latching element pairs, six latching element pairs or even more latching element pairs, can be provided. Exactly four latching element pairs are very particularly preferably provided.

The latching element pairs are preferably disposed so as to be distributed in a mutually equidistant manner along the circumference of the feedthrough, or of the compensation element, respectively.

It can be provided that the first latching element of the mounting structure is configured as a latching recess, and the second latching element of the compensation element is configured as a latching hook, or vice versa.

A compensation element, which is in particular configured as a shielding element, can be advantageously fastenable to the front plate, in particular the mounting structure of the front plate, while using a combination of a latching recess and a latching hook.

In an advantageous refinement of the invention, it can alternatively or additionally also be provided, however, that the compensation element has openings for feeding through corresponding pins or webs of the mounting structure, wherein the pins or webs are deformable so as to, in the deformed state of said pins or webs (in particular in a compressed state) configure a form-fit for the compensation element.

The fastening by means of the pins/webs and the openings of the compensation element can take place in the manner of a penetrating joining process, or a clinching process, respectively.

In the context of the invention it can also be provided that at least one compensation element serves as a fastening element for fastening the plug connector within the feedthrough or to the front plate. The compensation element can thus also provide only an assembling function.

In a refinement of the invention it can be provided that a plurality of feedthroughs for feeding through a respective plug connector are provided, wherein each of the feedthroughs has at least one of the compensation elements.

In principle however, only exactly one feedthrough for feeding through exactly one plug connector can also be provided. However, a plurality of, for example only, and without limitation, two, three, four, five, six, seven, eight, nine, ten or even more, feedthroughs for a respective plug connector are preferably provided.

The invention also relates to a housing module having a front plate according to the embodiments disclosed herein, and the housing disclosed herein.

An advantageous housing module for a control installation, or for a control apparatus, can thus be provided, said housing module preferably having a shielding and/or sealing function.

The invention moreover relates to a connection assembly for a vehicle, in particular for a motor vehicle, having a housing module according to the embodiments disclosed herein, and the control installation disclosed herein and the plug connector disclosed herein.

A connection assembly having a front plate can advantageously be provided, wherein at least one sealing compensation element (sealing element) and/or at least one shielding compensation element (shielding element) and/or at least one compensation element (fastening element) fastening the plug connector and/or at least one other tolerance-compensating element are/is in each case disposed in each feedthrough of the front plate.

The plug connector is preferably configured as an electric plug connector. In principle however, the use of optical plug connectors or hybrid electrical/optical plug connectors can also be provided in the context of the invention. In as far as reference in the present description and/or in the claims is made to electrical or electronic components, this reference can also be interpreted to include optical components or electrical/optical components.

The plug connector is not restricted to a specific type of plug connector, whereby the invention is in particular suitable for electrical plug connectors for the high-frequency engineering sector. This herein can in particular be plug connectors of the type PL, BNC, TNC, SMBA (FAKRA), SMA, SMB, SMS, SMC, SMP, BMS, HFM (FAKRA-Mini), H-MTD, BMK, Mini-Coax, or MATE-AX, but is not limited thereto. The plug connector can have one internal conductor and/or external conductor or a plurality of internal conductors and/or external conductors.

Insofar as a plurality of feedthroughs are provided, identical plug connector types, or else different plug connector types (for example also different variants of plug connector types or different sizes/dimensions of plug connector types), can in each case be provided in the different feedthroughs.

The control installation can be configured as a microprocessor. Instead of a microprocessor, any arbitrary further installation for implementing the control installation can also be provided, in particular one assembly or a plurality of assemblies of discrete electric components on a circuit board, a programmable logic controller (PLC), an application-specific integrated circuit (ASIC), or any other programmable circuit, for example also a field programmable gate array (FPGA), a programmable logic array (PLA) and/or a commercially available computer.

The control installation can particular preferably be configured as a control apparatus of a motor vehicle.

In an advantageous refinement of the invention it can be provided that the control installation has an electric circuit board which is established in the housing, wherein the plug connector is configured as a circuit board plug connector and is electrically (and/or optically) and mechanically connected to the circuit board.

The invention also relates to a vehicle, in particular a motor vehicle, having a connection assembly according to the embodiments disclosed herein.

The term "vehicle" here describes any mobility device, in particular but not is not limited to land craft, watercraft, aircraft, also including spacecraft.

The invention also relates to an assembling method for a connection assembly.

In the context of the assembling method it can be provided that a control installation, in particular an electric circuit board of a control installation, is assembled in a housing. At least one circuit board plug connector can be electrically and mechanically fastened to the circuit board before, during, or after assembling the circuit board in the housing.

A compensation element, or a plurality of compensation elements, for example a sealing element and a shielding element, can be assembled in, or on, a front plate which defines at least one feedthrough for the plug connector, or for the circuit board plug connector, respectively. The sealing element and/or the shielding element can be fastened on, or in, the front plate, for example be latched to the latter, or be fastened by forming, for example clinching.

The front plate can be placed onto the housing, preferably once the circuit board with the plug connectors has been assembled in the housing. The plug connectors can be routed through the feedthroughs while the front plate is being placed, wherein the compensation elements are able to compensate an offset between the plug connectors and the respective feedthrough.

Features which have been described in the context of one object of the invention, specifically provided by the front plate, the housing module, the connection assembly, the vehicle and the assembling method according to the invention, can also be advantageously implemented for other objects of the invention. Likewise, advantages which have been mentioned in the context of one object of the invention can also be understood to relate to the other objects of the invention.

In addition, it should be noted that expressions such as "comprising", "having" or "with" do not exclude any other features or steps. Furthermore, expressions such as "a/an" or "the" that refer in the singular to steps or features do not exclude a plurality of features or steps—and vice versa.

Terms such as "first" or "second" etc. are used predominantly for the sake of distinguishability between respective device or method features, and are not imperatively intended to indicate that features are mutually dependent or relate to one another.

It is furthermore emphasized that the values and parameters described in the present case also encompass deviations or fluctuations of ±10% or less, preferably ±5% or less, more preferably ±1% or less, and very particularly preferably ±0.1% or less, of the respectively stated value or parameter, if such deviations are not ruled out in practice in the implementation of the invention. The specification of ranges by way of start and end values also encompasses all values and fractions encompassed by the respectively stated range, in particular the start and end values and a respective mean value.

Exemplary embodiments of the invention will be described in more detail hereunder by means of the Figures.

The Figures each show preferred exemplary embodiments in which individual features of the present invention are illustrated in combination with one another. Features of one exemplary embodiment may also be implemented separately from the other features of the same exemplary embodiment, and may accordingly be readily combined by an expert to form further useful combinations and sub-combinations with features of other exemplary embodiments.

Elements of identical function are denoted by the same reference designations in the Figures.

SUMMARY

A principal aspect of the present invention is a front plate for a housing of a control installation, having a feedthrough for a plug connector, characterized by at least one compensation element for compensating a tolerance-related offset ($V_A$, $V_R$) between the plug connector and the feedthrough is disposed in the feedthrough and/or adjacent to the feedthrough.

A further aspect of the present invention is a front plate characterized in that the feedthrough has a groove for receiving the compensation element, and/or a step for bearing the compensation element.

A further aspect of the present invention is a front plate characterized in that the compensation element is configured in the shape of a subring or a ring.

A further aspect of the present invention is a front plate characterized in that at least one of the compensation elements is configured as a sealing element.

A further aspect of the present invention is a front plate characterized in that at least one of the compensation elements is configured as a shielding element so as to establish an electrical connection between an external conductor of the plug connector and the front plate, wherein the shielding element preferably has a plurality of contact elements, in particular spring lugs.

A further aspect of the present invention is a front plate characterized in that two groups of spring lugs are provided, wherein a first group of inner spring lugs is provided, the latter being configured for contacting the external conductor of the plug connector, and wherein a second group of outer spring lugs is provided, the latter being configured for contacting the front plate.

A further aspect of the present invention is a front plate characterized in that the spring lugs by way of a respective first end portion are attached to the shielding element, and have a respective free second end portion so as to contact the external conductor of the plug connector, or the front plate, respectively, wherein the spring lugs are aligned in such a manner that the free second end portion of said spring lugs extends away from the front plate.

A further aspect of the present invention is a front plate characterized in that the spring lugs by way of a respective first end portion are attached to the shielding element, and have a respective free second end portion so as to contact the external conductor of the plug connector, or the front plate, respectively, wherein the spring lugs are aligned in such a manner that the free second end portion of said spring lugs extends in the direction of the front plate.

A further aspect of the present invention is a front plate characterized in that the spring lugs by way of a respective first end portion are attached to the shielding element, and have a respective free second end portion so as to contact the external conductor of the plug connector, or the front plate, respectively, wherein the inner spring lugs are aligned in such a manner that the free second end portion of said inner spring lugs extends in the direction of the front plate, wherein the outer spring lugs are aligned in such a manner that the free second end portion of said outer spring lugs extends away from the front plate.

A further aspect of the present invention is a front plate characterized in that the inner spring lugs have a bend, preferably in the region of the free second end portion of said inner spring lugs, so as to configure a capture region for the plug connector for the assembling of the plug connector.

A further aspect of the present invention is a front plate characterized by a mounting structure for fastening the plug connector and/or the compensation element to the front plate.

A further aspect of the present invention is a front plate in that the mounting structure, proceeding from the front plate, extends into the internal side of the housing, wherein the feedthrough runs through the front plate and through the mounting structure.

A further aspect of the present invention is a front plate characterized in that the compensation element, proceeding from the internal side of the housing, is able to be placed onto the mounting structure or introduced into the mounting structure.

A further aspect of the present invention is a front plate characterized in that a plurality of feedthroughs for feeding through a respective plug connector are provided, wherein each of the feedthroughs has at least one of the compensation elements.

A further aspect of the present invention is a housing module, having a front plate and a housing.

A still further aspect of the present invention is a connection assembly for a vehicle, in particular for a motor vehicle, having a housing module a control installation and a plug connector.

An even still further aspect of the present invention is a vehicle, in particular motor vehicle, having a connection assembly.

These and other aspects of the present invention will be fully disclosed in more detail, as is required by the statutes, herein.

BRIEF DESCRIPTIONS OF THE FIGURES

In the Figures, in each case schematically:

DETAILED WRITTEN DESCRIPTION OF THE PREFERRED EMBODIMENTS

This disclosure of the invention is submitted in furtherance of the Constitutional purposes of the US Patent Laws "to promote the progress of science and useful arts" (Article 1, Section 8).

Figure 1:
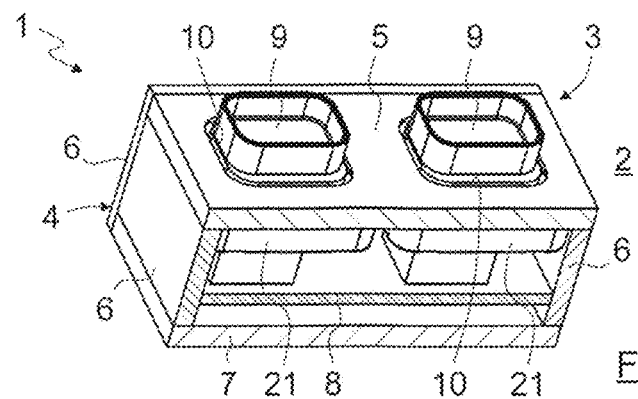
FIG. 1 shows a connection assembly for a vehicle according to the invention, having a housing module, with a housing and a front plate, a control installation, and two plug connectors, in a perspective sectional illustration.

FIG. 1 shows a connection assembly 1, in particular for use in a vehicle, particularly preferably in a motor vehicle.

The connection assembly 1 has a housing module 3 having a housing 4 and a front plate 5. The housing 4 may have lateral walls 6 and a base plate 7.

The connection assembly 1 moreover comprises a control installation 8 which can be configured as an electric circuit board, for example, or can have at least one circuit board. The control installation 8 in FIG. 1 is shown as a circuit board in only a heavily simplified manner.

Plug connectors 9, in particular the circuit board plug connectors illustrated, can be provided for connecting to further, external control installations, sensors, actuators or other electrical systems. In the exemplary embodiments, the plug connectors 9 are indicated in only a schematic manner as "black boxes". In principle, the invention may be suitable for use with arbitrary plug connectors 9, in particular also for use with plug connectors 9 of different construction modes.

The plug connectors 9 are routed through respective feedthroughs 10 defined in the front plate 5. For reasons of tolerances, the assembling of the front plate 5 is often difficult or even impossible by virtue of an offset between the plug connectors 9 and the feedthroughs 10.

According to the invention, an offset between the plug connector 9 and the respective feedthrough 10 can be compensated.

The front plate 5 can, in principle, have an arbitrary number of feedthroughs 10 for feeding through respective plug connectors 9. Solely for the purpose of only highlighting the principle, exactly two feedthroughs 10, or exactly two plug connectors 9, respectively, are illustrated in the exemplary embodiments, but this is not limiting.

In order for the offset (axial offset $V_A$, radial offset $V_R$ and/or tilting angle between the longitudinal axis L of the plug connector and the central axis M of the feedthrough 10 (cf. in each case FIG. 2) to be compensated, at least one compensation element 12, 15 is provided for the respective feedthrough 10.

The compensation element 12, 15 can be disposed in the feedthrough 10 and/or adjacent to the feedthrough 10. FIGS. 2 to 11 herein are intended to highlight only in a schematic and exemplary manner a few possibilities for implementing the invention.

Figure 2:
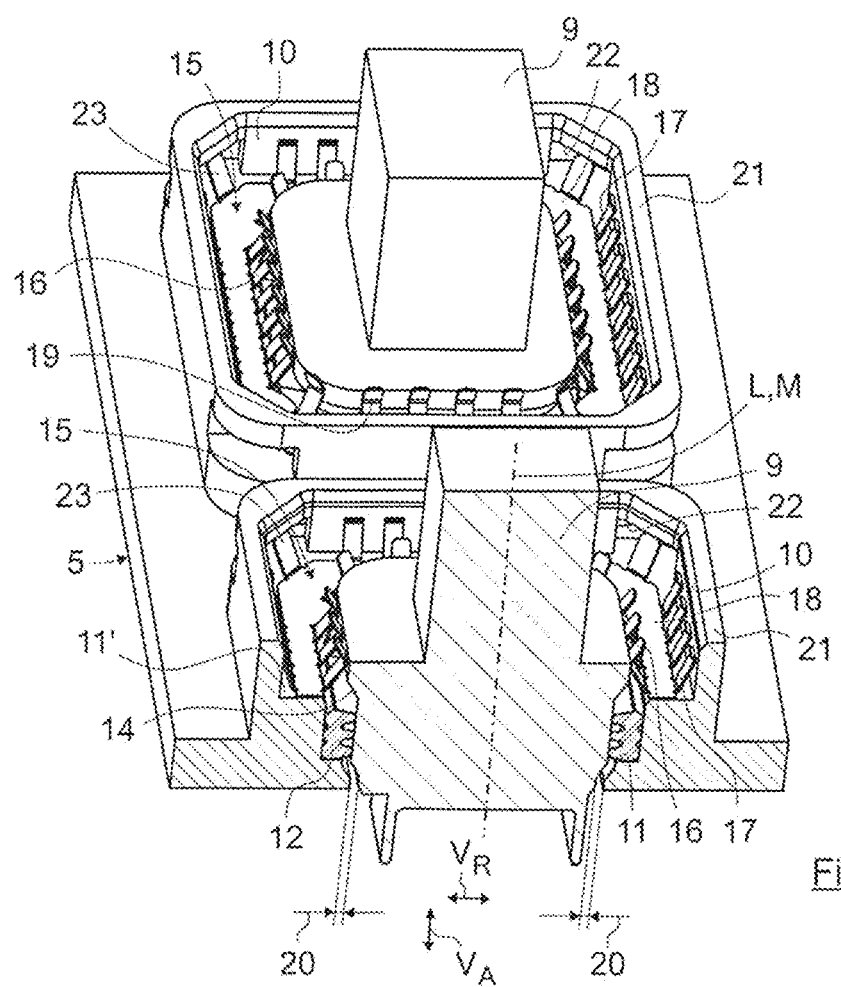
FIG. 2 shows a front plate according to a first exemplary embodiment of the invention, having sealing elements and having shielding elements which are latched in the front plate, in a perspective sectional illustration.
Figure 3:
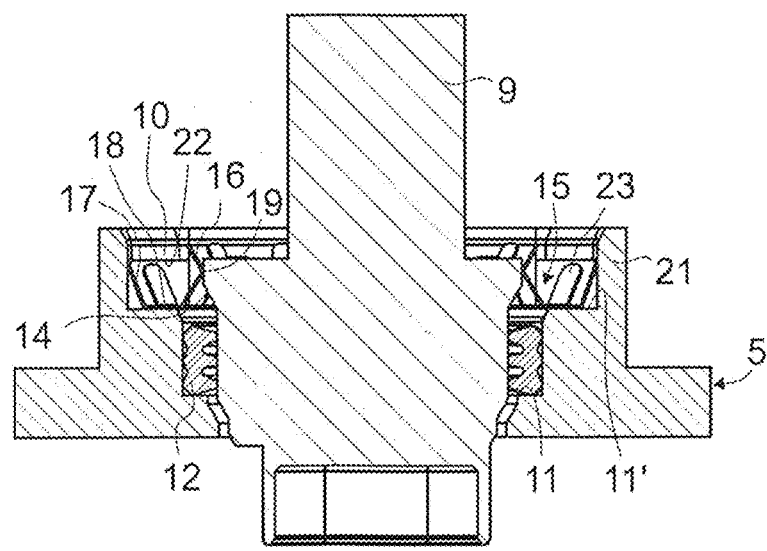
FIG. 3 shows the front plate of FIG. 2 in a lateral cross-sectional illustration.

A front plate 5, according to a first exemplary embodiment of the invention, is shown in a perspective sectional illustration in FIG. 2. The front plate 5 is shown from the inside, or proceeding from the internal side of the housing 4, not shown in more detail in FIGS. 2 to 11, respectively. FIG. 3 shows the front plate 5 in a cross-sectional lateral view. An exploded illustration, or an advantageous assembling sequence, respectively, is illustrated in FIG. 6.

The feedthrough 10 is configured in a stepped manner and has a first step 11 (cf. in particular FIG. 6), a compensation element configured as a sealing element 12 bearing thereon. The sealing element 12 is configured in the shape of a ring, or as an annular seal, respectively.

Figure 5:
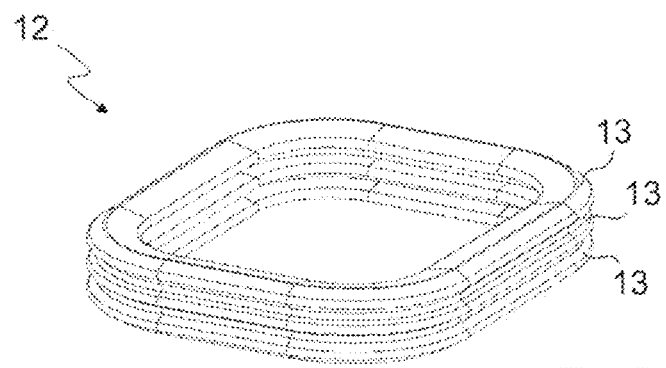
FIG. 5 shows a sealing element in a perspective stand-alone illustration.
Figure 6:
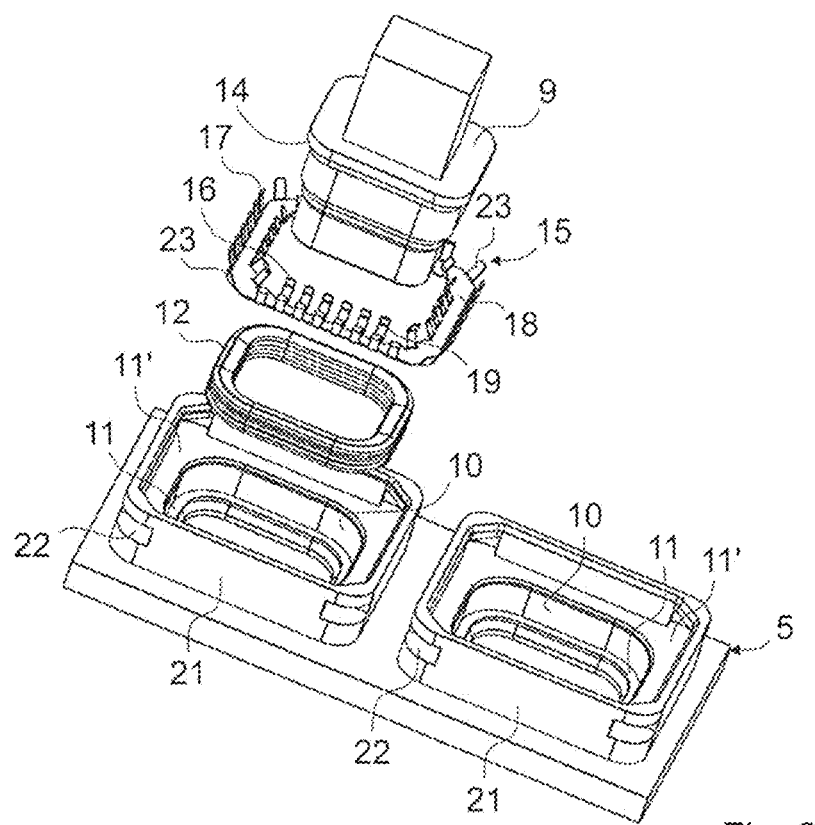
FIG. 6 shows an exploded illustration/assembly illustration of the front plate of FIG. 2.

One sealing element 12 is shown in an exemplary manner in a perspective stand-alone illustration in FIG. 5. The sealing element 12 has a plurality of spacedly arrayed (inner and outer) sealing lips 13 (cf. FIG. 5) which are mutually offset in the axial direction and along a central axis of the sealing element 12. The sealing lips 13 are preferably offset so as to be mutually equidistant.

The sealing element 12 in the assembled state thereof is positioned between the first step 11 of the feedthrough 10 and an optional protrusion 14 of the plug connector 9.

It can also be provided that the sealing element 12 is received within a groove defined in the feedthrough 10 (not shown in the exemplary embodiments).

The sealing element 12 can serve for sealing in relation to dirt, dust and/or moisture, and apart from compensating a parallel or radial, respectively, offset $V_R$ between the longitudinal axis L of the plug connector 9 and the central axis M of the feedthrough 10, also compensate a certain axial offset $V_A$ and/or a tilting angle.

In addition to the sealing element 12, the front plate 5 optionally moreover has a compensation element 12, 15 configured as a shielding element 15, so as to establish an electrical connection between an external conductor of the plug connector 9 and the front plate 5. To this end, the shielding element 15 has a plurality of contact elements which in the exemplary embodiments are configured as spring lugs 16, 17.

Figure 4:
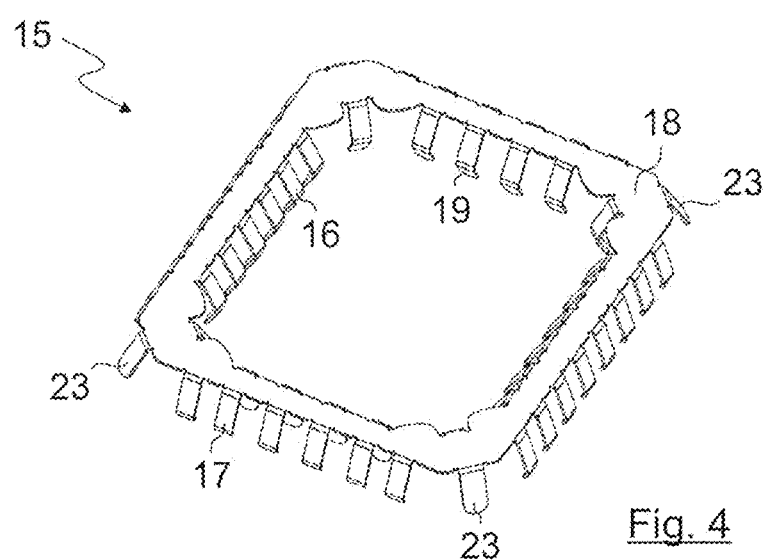
FIG. 4 shows the shielding element of the front plate of FIG. 2 in a perspective stand-alone illustration.

The shielding element 15 of the first exemplary embodiment, for the sake of improved visualization, is shown in a perspective stand-alone illustration in FIG. 4.

The contact elements, or the spring lugs 16, 17, respectively, are mutually offset along the circumference of the shielding element 15. Like the sealing element 12, the shielding element 15 is also configured in the shape of a completely encircling ring. The contact elements, or the spring lugs 16, 17, respectively, are preferably offset so as to be mutually equidistant. Particularly positive shielding can be provided in this way.

Two groups of spring lugs 16, 17 are in each case provided in the exemplary embodiments. A first group of inner spring lugs 16 is configured for contacting the external conductor of the plug connector 9. A second group of outer spring lugs 17 is configured for contacting the front plate 5. The spring lugs 16, 17 of the exemplary embodiments are in each case unilaterally attached to a base 18 of the shielding element 15. The spring lugs 16, 17, by way of a respective first end portion, are attached to the shielding element 15, and by way of a respective free second end portion, are configured for contacting the external conductor of the plug connector 9, or of the front plate 5, respectively.

In the exemplary embodiment illustrated in FIGS. 2 to 6, all spring lugs 16, 17 are aligned in such a manner that the free second end portion of said spring lugs 16, 17 extends away from the front plate 5. The shielding element 15 can thus be able to be assembled in a manner which is particularly simple and provides a reliable process (cf. FIG. 6), Furthermore, the shielding element 15, by way of the base 18 thereof, can advantageously bear on a second step 11' (FIG. 3) within the feedthrough 10. In order to also enable an ideally simple introduction of the plug connectors 9 through the feedthroughs 10 when assembling the front plate 5 on the housing 4, the inner spring lugs 16, in the region of the free second end portion thereof, can have a bend 19 so as to configure a capture region for the assembling of the plug connector 9.

The shielding element 15, by virtue of the spring lugs 16, 17, enables an advantageous compensation of an offset $V_A$, $V_R$ between the plug connector 9 and the feedthrough 10.

By using the compensation elements 12, 15 according to the invention, the respective feedthrough 10 can preferably be dimensioned in such a manner that the plug connector 9 can still be introduced into the feedthrough 10 even in the case of large tolerances. Gaps 20, which in this instance are configured in the assembled state, (cf. FIG. 2) can ultimately be compensated by the compensation elements 12, 15 even when the latter are not uniformly distributed on account of the offset between the plug connector 9 and the feedthrough 10.

The front plate 5 can have a mounting structure 21 for fastening the plug connector 9 and/or the compensation element 12, 15 on the front plate 5. The mounting structure 21, proceeding from the front plate 5, extends into the internal side of the housing 4. The feedthrough 10 runs through the front plate 5 and through the mounting structure 21.

The compensation element 12, 15, proceeding from the internal side of the housing 4, can be placed onto the mounting structure 21 (described herein in the context of the second exemplary embodiment) or be able to be introduced into the mounting structure 21, as is the case in the first exemplary embodiment.

The mounting structure 21, in the first exemplary embodiment, has a first latching element which is configured as a latching recess 22. The compensation element 12, 15 has a corresponding second latching element which is configured as a latching hook 23, similar to the spring lugs 16, 17. The two latching elements 22, 23 form a common latching element pair for latching the compensation element 12, 15 to the mounting structure 21. A plurality of latching element pairs is preferably provided (exactly four latching element pairs in the exemplary embodiment), said latching element pairs being disposed at the respective corners of the feedthrough 10, or of the mounting structure 21 or of the shielding element 15, respectively.

Alternative fastening techniques are of course also possible.

Figure 7:
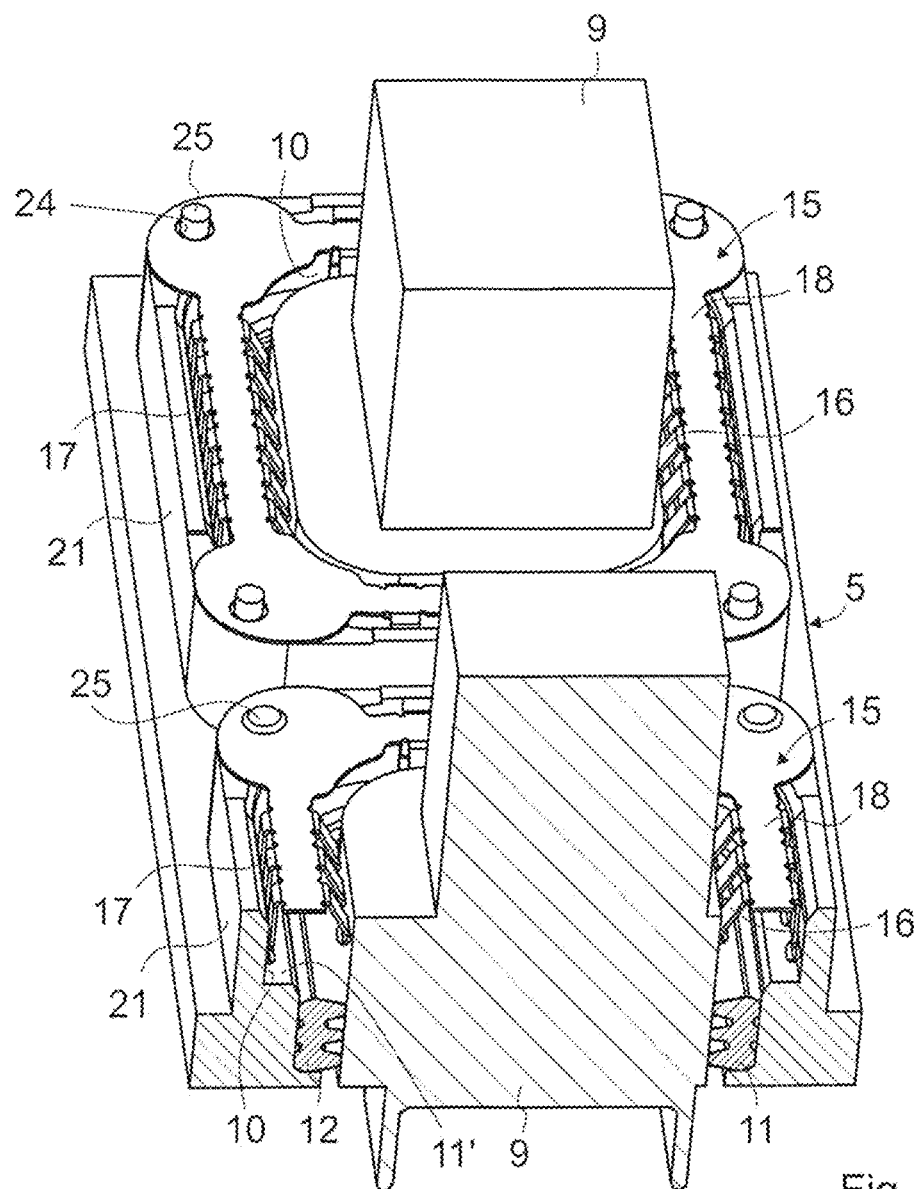
FIG. 7 shows a front plate according to a second exemplary embodiment of the invention, having sealing elements, and having shielding elements placed on the front plate, in a perspective sectional illustration.
Figure 8:
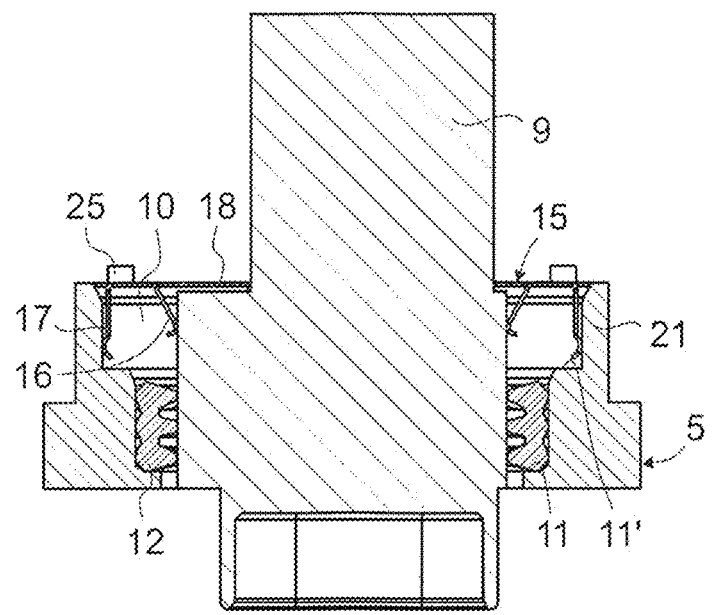
FIG. 8 shows the front plate of FIG. 7 in a lateral cross-sectional illustration.
Figure 9:
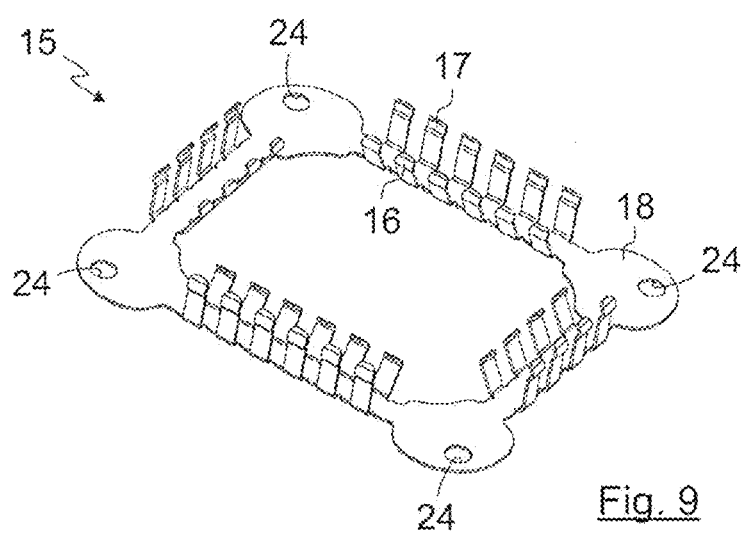
FIG. 9 shows the shielding element of the front plate of FIG. 7 in a perspective stand-alone illustration.
Figure 10:
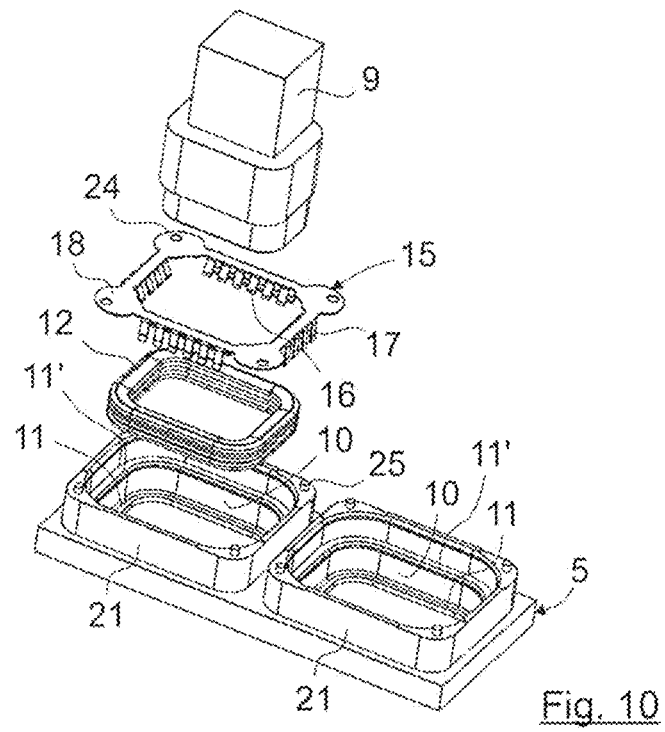
FIG. 10 shows an exploded illustration/assembly illustration of the front plate of FIG. 7.

A second exemplary embodiment of the invention is shown in FIGS. 7 to 10. An alternative fastening technique and an alternative design embodiment of the shielding element 15 are in particular to be demonstrated here. FIG. 7 shows a perspective sectional illustration, and FIG. 8 shows a lateral cross-sectional illustration, of the front plate 5 of the second exemplary embodiment. A corresponding exploded illustration, or an advantageous assembling sequence, respectively, is illustrated in FIG. 10.

In principle, the features of all exemplary embodiments of the present invention can be combined with one another unless this is technically precluded. Features which have already been described in the context of the first exemplary embodiment will not be explained once again with reference to the second and the subsequent third exemplary embodiment.

According to the second exemplary embodiment of the invention, the spring lugs 16, 17 are aligned in such a manner that the free second end portion thereof extends in the direction of the front plate 5. In this way, the assembling of the front plate 5 on the plug connectors 9, or the introducing of the plug connectors 9 into the feedthroughs 10, respectively, can be simplified because an even larger capture region can be configured.

The shielding element 15 of the second exemplary embodiment, which in FIG. 9 is shown in an exemplary manner in a perspective stand-alone illustration, can define openings 24 for feeding through corresponding pins 25 or webs of the mounting structure 21. The pins 25, or webs 25, respectively, can be deformable so as to, in the deformed state thereof, configure a form-fit for the compensation element 12, 15, as is known from a penetrating joining process, for example. In FIG. 7, the front shielding element 15, shown in a sectional illustration, is in an exemplary manner connected to the mounting structure 21 by way of the already deformed, or compressed, respectively, pins 25, whereas the second shielding element 15, illustrated at the top in FIG. 7, has not yet been connected to the mounting structure 21 thereof.

Figure 11:
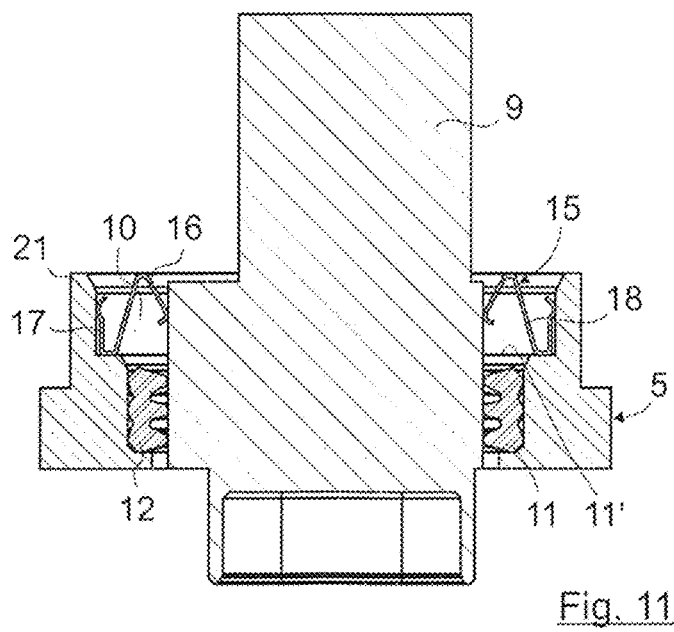
FIG. 11 shows a front plate according to a third exemplary embodiment of the invention in a lateral cross-sectional illustration.

A further possibility for configuring a shielding element 15 is to be demonstrated by means of a third exemplary embodiment illustrated in FIG. 11.

According to the third exemplary embodiment, the inner spring lugs 16 are aligned in such a manner that the free second end portion thereof extends in the direction of the front plate 5. In contrast, the outer spring lugs 17 are aligned in such a manner that the free second end portion thereof extends away from the front plate 5. On the one hand, the assembling of the shielding element 15 can be particularly simple in this way, wherein a particularly simple placing of the front plate 5 onto the plug connectors 9 can simultaneously also be enabled. The construction of the shielding element 15, or the production of the latter, in this instance can however be more complex.

OPERATION

Having thus described the structure of our Front Plate for a Housing of a Control Installation, Housing Module, Connection Assembly, and Vehicle its operation is briefly described.

A principal object of the present invention is a front plate 5 for a housing 4 of a control installation 8, defining a plug connector feedthrough 10, comprising: a compensation element 12, 15 that is disposed in the plug connector feedthrough 10 or adjacent the plug connector feedthrough 10; and wherein the compensation element 12, 15 compensates for a tolerance related offset ($V_A$, $V_R$) between the plug connector feedthrough 10 and a plug connector 9.

A further object of the present invention is a front plate 5 wherein the plug connector feedthrough 10 defines a groove for receiving the compensation element 12, 15.

A further object of the present invention is a front plate 5 wherein the compensation element 12, 15 is configured in the shape of a subring or a ring.

A further object of the present invention is a front plate 5 and wherein the compensation element 12, 15 is configured as a sealing element 12.

A further object of the present invention is a front plate 5 wherein the compensation element 12, 15 is configured as a shielding element 15 to establish an electrical connection between an external conductor of the plug connector 9 and the front plate (5); and wherein the shielding element 15 has a plurality of contact elements that are spring lugs (16, 17).

A further object of the present invention is a front plate 5 and further comprising: two groups of spring lugs 16, 17, and wherein a first group of inner spring lugs (16) is configured for contacting the external conductor of the plug connector 9; and a second group of outer spring lugs 17 is configured for contacting the front plate (5).

A further object of the present invention is a front plate 5 wherein the spring lugs 16, 17 each have a first end portion and each have a free second end portion; and the first end portion of each spring lug is are attached to the shielding element 15; and the free second end portion of each spring lug contacts the external conductor of the plug connector 9, or the front plate 5, and wherein the spring lugs 16, 17 are aligned so that the free second end portion of each spring lug 16, 17 extends away from the front plate 5.

A further object of the present invention is a front plate 5 wherein the inner spring lugs 16 each have a bend 19, preferably in a region of the free second end portion to configure a capture region for the plug connector 9 for assembling the plug connector 9.

A further object of the present invention is a front plate 5 and further comprising: a mounting structure 21 for fastening at least one of the plug connector 9 and the compensation element 12, 15 to the front plate 5.

A further object of the present invention is a front plate 5 wherein the mounting structure 21, proceeding from the front plate 5, extends into an internal side of the housing 4, and the plug connector feedthrough 10 extends through the front plate 5 and through the mounting structure 21.

A further object of the present invention is a front plate 5 wherein the compensation element 12, 15, proceeding from the internal side of the housing 4, is able to be placed onto the mounting structure 21 or introduced into the mounting structure 21.

A further object of the present invention is a front plate 5 and further comprising: a plurality of plug connector feedthroughs 10 each for feeding through a respective plug connector 9; and wherein each of the plurality of plug connector feedthroughs 10 has a compensation element 12, 15.

A further object of the present invention is a housing module 3 comprising: a housing for a control installation; a front plate 5 for the housing of the control installation; a plug connector feedthrough 10 defined in the front plate 5; and a compensation element 12, 15 that is disposed in the plug connector feedthrough 10 or adjacent to the plug connector feedthrough 10; and wherein the compensation element 12, 15 compensates for a tolerance-related offset ($V_A$, $V_R$) between the plug connector feedthrough 10 defined in the front plate 5 and a plug connector 9 therein.

A further object of the present invention is a front plate 5 wherein the plug connector feedthrough 10 defines a step 11, 11' for bearing the compensation element 12, 15.

A further object of the present invention is a front plate 5 wherein the spring lugs 16, 17 each have a first end portion and each have a free second end portion; and the first end portion of each spring lug 16, 17 is attached to the shielding element 15; and the free second end portion of each spring lug 16, 17 contacts the external conductor of the plug connector 9, or the front plate 5, and wherein the spring lugs 16, 17 are aligned so that the free second end portion of said spring lugs 16, 17 extends in the direction of the front plate 5.

A further object of the present invention is a front plate 5 wherein the spring lugs 16, 17 each have a first end portion, and each have a free second end portion; and the first end portion of each spring lug 16, 17 is attached to the shielding element 15; and the free second end portion of each spring lug 16, 17 contacts the external conductor of the plug connector 9, or the front plate 5, respectively, and wherein the inner spring lugs 16 are aligned so that the free second end portion of said inner spring lugs 16 extends in the direction of the front plate 5, and wherein the outer spring lugs 17 are aligned so that the free second end portion of said outer spring lugs 17 extend away from the front plate 5.

A further object of the present invention is a connection assembly 1 for a vehicle having a control installation 8, and a plug connector 9, the connection assembly comprising: a housing for the control installation; a front plate 5 for the housing of the control installation; a plug connector feedthrough 10 defined in the front plate 5; and a compensation element 12, 15 or compensating a tolerance-related offset ($V_A$, $V_R$) between the plug connector feedthrough 10 and a plug connector 9; and wherein the compensation element 12, 15 is disposed in the plug connector feedthrough 10 or adjacent to the plug connector feedthrough 10.

An even still further object of the present invention is a connection assembly 1 further comprising: a housing module 3.

In compliance with the statute, the present invention has been described in language more or less specific, as to structural and methodical features. It is to be understood, however, that the invention is not limited to the specific features shown and described since the means herein disclosed comprise preferred forms of putting the invention into effect. The invention is, therefore, claimed in any of its forms or modifications within the proper scope of the appended claims appropriately interpreted in accordance with the Doctrine of Equivalents.

The invention claimed is:

1. A front plate for a housing of a control installation, defining a plug connector feedthrough, comprising:
   a compensation element that is disposed in the plug connector feedthrough or adjacent the plug connector feedthrough; and wherein
   the compensation element compensates for a tolerance related offset ($V_A$, $V_R$) between the plug connector feedthrough and a plug connector; and wherein
   the compensation element is configured as a sealing element that seals an interior defined by the housing.

2. The front plate as claimed in claim 1 and wherein the plug connector feedthrough defines a groove for receiving the compensation element.

3. The front plate as claimed in claim 1 and wherein the compensation element is configured in the shape of a subring or a ring.

4. The front plate as claimed in claim 1 and wherein the compensation element is configured as a shielding element to establish an electrical connection between an external conductor of the plug connector and the front plate; and wherein
the shielding element has a plurality of contact elements, that are spring lugs.

5. A front plate for a housing of a control installation, defining a plug connector feedthrough, comprising:
a compensation element that is disposed in the plug connector feedthrough or adjacent the plug connector feedthrough; and wherein
the compensation element compensates for a tolerance related offset ($V_A$, $V_R$) between the plug connector feedthrough and a plug connector; and
the compensation element is configured as a shielding element to establish an electrical connection between an external conductor of the plug connector and the front plate; and wherein
the shielding element has a plurality of contact elements, that are spring lugs; and wherein
a first group of inner spring lugs is configured for contacting the external conductor of the plug connector; and
a second group of outer spring lugs is configured for contacting the front plate.

6. The front plate as claimed in claim 4 and wherein the spring lugs each have a first end portion and each have a free second end portion; and
the first end portion of each spring lug is attached to the shielding element; and
the free second end portion of each spring lug contacts the external conductor of the plug connector, or the front plate, and wherein
the spring lugs are aligned so that the free second end portion of each spring lug extends away from the front plate.

7. The front plate as claimed in claim 5 and wherein the inner spring lugs each have a bend, preferably in a region of the free second end portion to configure a capture region for the plug connector for assembling the plug connector.

8. The front plate as claimed in claim 1 and further comprising:
a mounting structure for fastening at least one of the plug connector and the compensation element to the front plate.

9. The front plate as claimed in claim 8 and wherein mounting structure, proceeding from the front plate, extends into an internal side of the housing; and
the plug connector feedthrough extends through the front plate and through the mounting structure.

10. The front plate as claimed in claim 9 and wherein the compensation element, proceeding from the internal side of the housing, is able to be placed onto the mounting structure or introduced into the mounting structure.

11. The front plate as claimed in claim 1 and further comprising:
a plurality of plug connector feedthroughs each for feeding through a respective plug connector; and wherein each of the plurality of plug connector feedthroughs has a compensation element.

12. A housing module comprising:
a housing for a control installation;
a front plate for the housing of the control installation;
a plug connector feedthrough defined in the front plate; and
a compensation element that is disposed in the plug connector feedthrough or adjacent to the plug connector feedthrough; and wherein
the compensation element compensates for a tolerance-related offset ($V_A$, $V_R$) between the plug connector feedthrough defined in the front plate and a plug connector therein; and wherein
the compensation element is configured as a sealing element that seals an interior defined by the housing.

13. The front plate as claimed in claim 1 and wherein the plug connector feedthrough defines a step for bearing the compensation element.

14. The front plate as claimed in claim 4 and wherein the spring lugs each have a first end portion and each have a free second end portion; and
the first end portion of each spring lug is attached to the shielding element; and
the free second end portion of each spring lug contacts the external conductor of the plug connector, or the front plate, and wherein
the spring lugs are aligned so that the free second end portion of said spring lugs extends in the direction of the front plate.

15. The front plate as claimed in claim 5 and wherein the spring lugs each have a first end portion, and each have a free second end portion; and
the first end portion of each spring lug is attached to the shielding element; and
the free second end portion of each spring lug contacts the external conductor of the plug connector, or the front plate, respectively, and wherein
the inner spring lugs are aligned so that the free second end portion of said inner spring lugs extends in the direction of the front plate, and wherein the outer spring lugs are aligned so that the free second end portion of said outer spring lugs extend away from the front plate.

16. A connection assembly for a vehicle having a control installation, and a plug connector, the connection assembly comprising:
a housing for the control installation;
a front plate for the housing of the control installation;
a plug connector feedthrough defined in the front plate; and
a compensation element for compensating a tolerance-related offset ($V_A$, $V_R$) between the plug connector feedthrough and the plug connector; and wherein
the compensation element is disposed in the plug connector feedthrough or adjacent to the plug connector feedthrough; and wherein
the compensation element is configured as a sealing element that seals an interior defined by the housing.

17. The connection assembly as claimed in claim 16 and further comprising:
a housing module.

* * * * *